United States Patent [19]

Kasakura et al.

[11] Patent Number: 5,686,231
[45] Date of Patent: Nov. 11, 1997

[54] PROCESS FOR DISPOSING OF DEVELOPER FOR PIGMENT-CONTAINING NON-SILVER-SALT PHOTO SENSITIVE MATERIAL, APPARATUS THEREFOR AND AUTOMATIC DEVELOPING SYSTEM

[75] Inventors: Akeo Kasakura; Takeshi Kaneda, both of Yokohama, Japan

[73] Assignee: Mitsubishi Chemical Corporation, Japan

[21] Appl. No.: 702,514

[22] PCT Filed: Apr. 24, 1995

[86] PCT No.: PCT/JP95/00802

§ 371 Date: Sep. 25, 1996

§ 102(e) Date: Sep. 25, 1996

[87] PCT Pub. No.: WO96/20434

PCT Pub. Date: Jul. 4, 1996

[30] Foreign Application Priority Data

Dec. 27, 1994 [JP] Japan .................. 6-325880
Jan. 31, 1995 [JP] Japan .................. 7-014153

[51] Int. Cl.$^6$ ............................................ G03F 7/32
[52] U.S. Cl. ................................... 430/399; 430/398
[58] Field of Search ............................. 430/398, 399

[56] References Cited

U.S. PATENT DOCUMENTS 5,077,179 12/1991 Abe et al. ...................... 430/398
5,112,491 5/1992 Strantz, Jr. ..................... 210/651
5,205,937 4/1993 Bhave et al. ................... 210/651
5,250,396 10/1993 Ueda et al. ..................... 430/398
5,329,331 7/1994 Hatori et al. ................... 354/299

FOREIGN PATENT DOCUMENTS 0 004 375 A2 10/1979 European Pat. Off. .
3143106 5/1983 Germany .
9142551 8/1984 Japan .
4-81764 3/1992 Japan .
4-353847 12/1992 Japan .
6-15078 2/1994 Japan .
6-194824 7/1994 Japan .

*Primary Examiner*—Hoa Van Le
*Attorney, Agent, or Firm*—Nixon & Vanderhye

[57] ABSTRACT

Waste developer used for the development of pigment-containing non-silver-salt photosensitive materials is disposed of by filtering through a filter which does not allow pigment particles to pass through and allows the waste developer solution to be treated to flow horizontally to the surface of the filter membrane. The solution which passed through the fiber membrane is reused as a developer. This process greatly decreases discharge of waste developer allows a long-time stabilized continuous developing process.

5 Claims, 3 Drawing Sheets

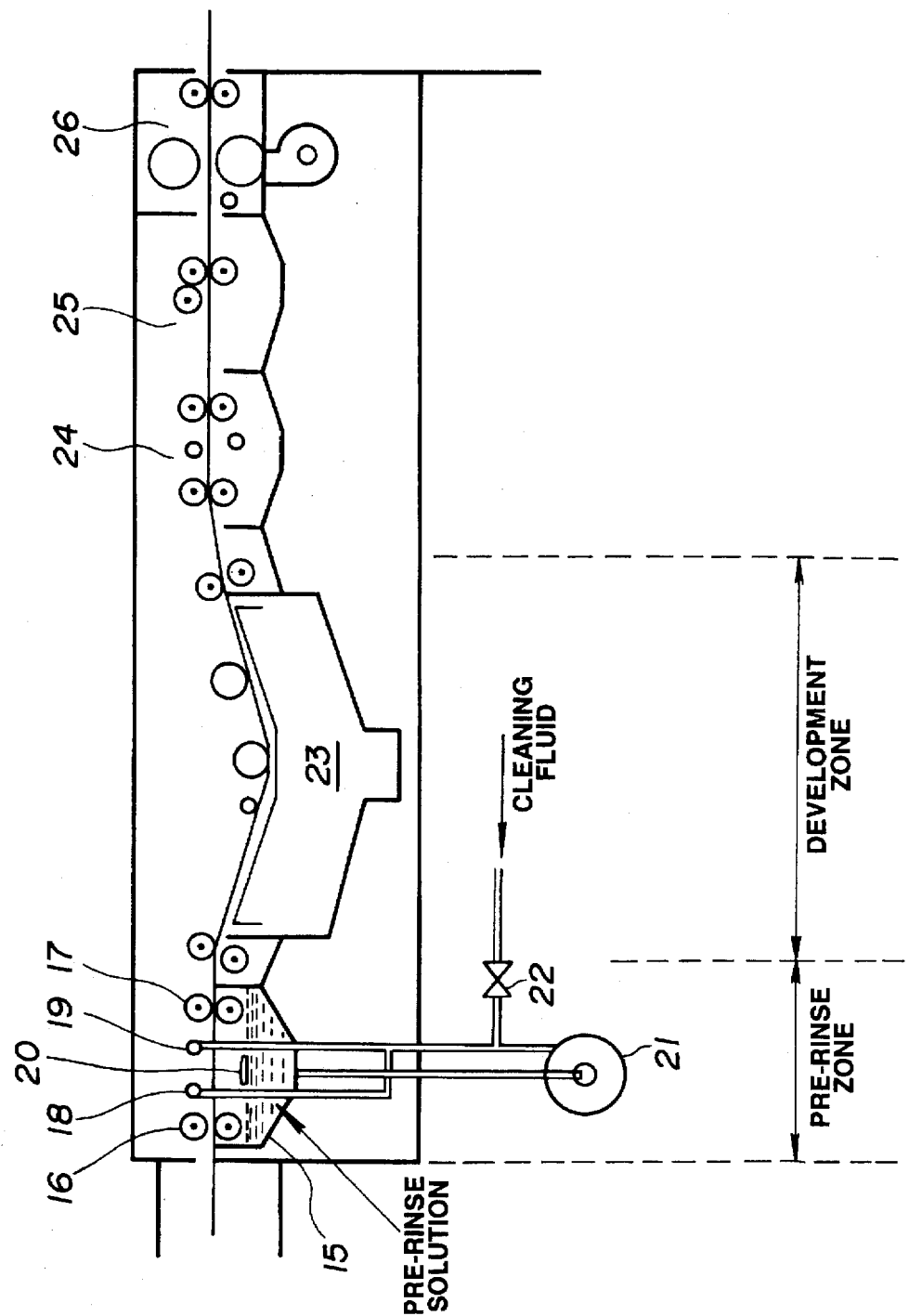

PROCESS FOR DISPOSING OF DEVELOPER FOR PIGMENT-CONTAINING NON-SILVER-SALT PHOTO SENSITIVE MATERIAL, APPARATUS THEREFOR AND AUTOMATIC DEVELOPING SYSTEM

FIELD OF ART

The present invention relates to a process for disposing of a waste developer generated after a developing process of an imagewise exposed pigment-containing non-silver-salt photo-sensitive material, an apparatus therefor and an automatic developing system having such an apparatus. More particularly the present invention relates to a process for disposing of a waste developer which is capable of lessening troubles associated with the insoluble matters and minimizing the amount of waste fluid, an apparatus therefor and an automatic developing system having such an apparatus.

BACKGROUND ART

In the conventional photo-sensitive material developing system in which a large number of imagewise exposed photo-sensitive materials are developed, it becomes impossible to conduct the satisfactory development due to fatigue of the developer as a result of gradual accumulation of the components of the photo-sensitive material eluted into the developer by repeating the developing process, due to the deactivation or oxidation of the developer by air, and due to other reasons such as evaporation of water from the developer during use. In the case of a pigment-containing non-silver-salt photo-sensitive material, since the component pigment is insoluble in the developer, this becomes a serious problem. This type of photo-sensitive material has involved various problems such as adhesion of the component pigment in the developer on the surface of the photo-sensitive material during the developing process and compaction of the piping in the developing system with the pigment.

Therefore, it has been necessary to supply the developer or an aqueous solution containing part of developer components in the course of the developing process, or to change the developer with fresh one after the developing process. However, the increase of the amount of the replenisher or the frequency of exchange of the developer entailed the problems of the corresponding increase of the amount of waste fluid and complication of the operations. There has popularly been used an automatic developing system for pre-sensitized planographic printing plates provided with a filter for removing dust or the developer components which have turned into sludge and become unable to stay dissolved in the developer. In the case of a pigment-containing non-silver-salt photo-sensitive material, however, it has been necessary to excessively increase the frequency of exchange of the filter because of a large amount of the substances to be removed such as pigment and an increased percentage of compaction of the filter. As a countermeasure against such compaction, it has been proposed to let the developer flow backward for removing dust in the filter (Japanese Patent Application Laid-Open (KOKAI) No. 2-1864), but this measure has not been so effective in the case of a pigment-containing non-silver-salt photo-sensitive material.

An object of the present invention is to solve the above-mentioned problems in the prior art, and to provide a developer disposing process which is capable of drastically reducing the amount of a waste developer by efficiently removing insoluble components composed principally of a pigment from a developer which has been used for developing a large number of pigment-containing non-silver-salt photo-sensitive materials, and recycling the obtained developer after removing the said insolubles; an apparatus used for this process; and an automatic developing system having such an apparatus.

The present inventors have made efforts for attaining the said object, and as a result, have found out a process which is substantially cleared of the said problems and capable of efficiently removing insoluble matters composed principally of a pigment, in the waste developer, and enables continuous developing operation in an industrially advantageous way for a long time. The present invention is attained based on this finding.

DISCLOSURE OF THE INVENTION

The present invention lies in a process for disposing of a waste developer used for a development of pigment-containing non-silver-salt photo-sensitive materials, comprising subjecting the waste developer used for the development of pigment-containing non-silver-salt photo-sensitive materials to a separating treatment with a filter which does not allow pigment particles to pass through and allows the waste developer solution to be treated to pass horizontally to a filtering membrane surface, and reusing the passed solution as a developer.

The present invention also lies in an apparatus for disposing of a waste developer used for a development of pigment-containing non-silver-salt photo-sensitive materials, comprising a waste developer storage tank (2) into which the waste developer used for the developing process of the pigment-containing non-silver-salt photo-sensitive material is supplied through a pipeline (1), a waste developer discharge means provided with the waste developer storage tank, a filter unit (3) into which the waste developer is supplied from the said storage tank (2) through a pipeline, the said filter unit comprising a filter which does not allow pigment particles to pass through and allows the waste developer solution to be treated to flow horizontally to a filtering membrane surface, a pipeline (4) through which the solution which does not pass through the filtering membrane in the said filter unit is returned to the said waste developer storage tank (2), and a pipeline (5) through which a solution which has passed through the filtering membrane is recovered as a regenerated developer.

The present invention further lies in an automatic developing system for pigment-containing non-silver-salt photo-sensitive material comprising a pre-sensitized planographic printing plate having in which at least a photopolymerizable sensitive layer and a protective layer containing a water-soluble polymeric binder are laminated successively on a substrate, the said system comprising a pre-rinse zone (section) where the protective layer is dissolved away with a pre-rinse solution, a development zone (section) provided posteriorly to the said pre-rinse section for developing the photo-sensitive layer, and a means for disposing of the waste developer released from the development section.

The present invention is described in detail below.

The pigment-containing non-silver-salt photo-sensitive material used in the present invention is not specified, it is possible to use known types of photo-sensitive materials which are developed by making use of-the change of its solubility in the developer after imagewise exposure. Examples of such photo-sensitive materials include positive pre-sensitized planographic printing plate, negative pre-sensitized planographic printing plate, color filter, solder resist and the like.

The photo-sensitive layer composition is not critical in the present invention. For example, a photo-sensitive composition comprises a quinonediazide compound, a diazo compound, a photopolymerizable compound or the like which is blended in an alkali-soluble resin such as phenol resin or acrylic resin. That is, the developer contains insoluble substances therein.

As for the pigment, a black pigment used for the color filter resist for black matrix, and the corresponding pigments used for the color filter resists for red, green and blue may be used.

The black pigments usable in the present invention include carbon black, graphites such as disclosed in Japanese Patent Application Laid-Open (KOKAI) Nos. 5-311109 and 6-11613, inorganic black pigments such as disclosed in Japanese Patent Application KOKAI Nos. 4-322219 and 3-274503, organic black pigments such as azo-type black pigment disclosed in Japanese Patent Application KOKAI No. 2-216102, and other black pigments mixed with red, green, flue, yellow, cyan, magenta or other organic colorants.

Exemplary of the pigments usable for red, green and blue color filter resists are Victoria Pure Blue (C.I. 42595), Auramine O (C.I. 41000), Catilon Brilliant Flayin (Basic 13), Rhodamine 6 GCP (C.I. 45160), Rhodamine B (C.I. 45170), Safranine OK 70:100 (C.I. 50240), Erioglaucine X (C.I. 42080), No. 120 Lionol Yellow (C.I. 21090), Lionol Yellow GRO (C.I. 21090), Symuler Fast Yellow 8 GF (C.I. 21105), Benzidine Yellow 4T-564D (C.I. 21095), Symuler Fast Red 4015 (C.I. 12355), Lionol Red 7B4401 (C.I. 15850), Fastgen Blue TRG-L (C.I. 74160), Lionol Blue SM (C.I. 26150), Lionol Blue ES (Pigment Blue 16:6 and Pigment Blue 1536), Lionol Red GD (Pigment Red 168 and Pigment Red 108), and Lionol Green 2YS (Pigment Green 36).

Other pigments usable in the present invention include (indicated by C.I. No.): yellow pigments 20, 24, 86, 93, 109, 110, 117, 125, 137, 138, 147, 148, 153, 154 and 166; orange pigments 36, 43, 51, 55, 59 and 61; red pigments 9, 97, 122, 123, 149, 168, 177, 180, 192, 215, 216, 217, 220, 223, 224, 226, 227, 228 and 240; violet pigments 19, 23, 29, 30, 37, 40 and 50; blue pigments 15, 15:1, 15:4, 22, 60 and 64; green pigment 7; and brown pigments 23, 25 and 26.

In the case of pre-sensitized planographic printing plate, a pigment is blended for the purpose of improving the developed visible image quality. In this case, since sensitivity of the photo-sensitive composition may lower depending on the pigment blended, it is preferable to select a pigment which shows no absorption in the wavelength region of the light source used for exposure. Phthalocyanine Blue is also preferred for use as pigment in the present invention.

The developer used in the present invention is not restricted but may be properly selected in accordance with the photo-sensitive material used. Various types of developer, including those used conventionally, can be used, but the alkaline developers with pH of 10 or more are preferred.

The filter used in the present invention is also not specified, it is possible to use various types of filter which don't allow pigment particles to pass through and allows the solution to be treated to flow horizontally to the surface of the filtering membrane, for example, (a) plate-type filters comprising a laminate of laminar elements, (b) spiral-type filters, (c) cartridge-type filters, (d) capillary-type filters packed with hollow fiber membrane, and (e) tubular type filters comprising a bundle of tubular membranes. Examples of these filters include NTF-5200 as (a) type; Nitkuria 201-AP, 201-AE, F401-AE, F-601-AE, F5005-AF, F4005-CE, F8005-CE, F13005-CF, Super Nitkuria SNF6000S, SNF6000L and SNF12000L as (b) type; and NTM-9002 as (d) and (e) types. (These are all trade names of the products available from Nitto Denko Co., Ltd). Among these filter modules, those using a hollow fiber precision filtering membrane and/or a hollow fiber ultrafiltration membrane, which are not of a whole filtration system, are preferred.

Precision filtration is principally intended to separate the insoluble matters such as pigment particles with a size of about 0.05 to 10 μm contained in the developer. The treating capacity of precision filtration is about 10 liters per hour for an effective membrane area of about 0.3 m$^2$.

The ultrafiltration membrane used in the present invention is preferably one having a cut off molecular weight (MWCO) (protein molecular weight representation) of 10,000 or more and capable of use at pH of 10 or more, preferably 10 to 13, in case where the developer used is alkaline. The solute inhibition percentages for the respective molecular weights may be broad. As for the membrane material, polysulfone, polyether sulfone, polyacrylonitrile and the like are preferably used.

The filter may be either an internally pressed-type filter or an externally pressed-type filter in case where the hollow fiber membranes are used. The filter module may be made of metal, plastic or other material which is proof against corrosion by the developer, but stainless steel, polysulfone or the like is preferred.

The said precision filtration or ultrafiltration modules may be used either as a single unit or in combination.

The developer disposing process according to the present invention can be applied to the disposal of the developers used for the development of various types of photo-sensitive materials such as mentioned above, and is capable of remarkably reducing the amount of the waste fluid released from the developing system while enabling stabilized long-time continuous run of development. The disposing process of the present invention is particularly advantageously applied to the pigment-containing pre-sensitized planographic printing plates having sensitivity to laser light in which at least a photo-sensitive layer made of a photopolymerizable composition and a protective layer containing a water-soluble polymeric binder are laminated successively in that order on a support.

Recently, growing interest has been shown in application of high-sensitivity materials using photopolymerizable sensitive substances in various fields of art, for example, laser direct plate-making system which is expected to come into practical use in near future, and thus a photopolymerized type pre-sensitized planographic printing plate of high sensitivity corresponding to the laser oscillation wavelengths, for example, the wavelength of 488 nm of argon ion laser or 532 nm which is frequency doubled YAG laser, has been keenly required.

According to such high-sensitivity photopolymerized type pre-sensitized planographic printing plates, usually an image is formed by polymerizing an addition polymerizable compound having ethylenic unsaturated double bonds in the photo-sensitive layer by generating radicals by application of laser light. This image forming method, however, is subjected to disturbance by oxygen in the air. Therefore, in these high-sensitivity photopolymerized type pre-sensitized planographic printing plates, a protective layer containing a water-soluble polymeric binder is laminated on the photo-sensitive layer to protect it against contact with oxygen. For development of these high-sensitivity photopolymerized type pre-sensitized planographic printing plates, an alkaline developer is used as in the case of the ordinary pre-sensitized planographic printing plates. Therefore, the high speed processing is strongly required in development of such plates as in the case of the ordinary pre-sensitized planographic printing plates.

Thus, the developing process of the present invention can be advantageously applied to the pigment-containing pre-sensitized planographic printing plates having sensitivity to laser light in which at least a photo-sensitive layer containing a photopolymerizable composition and a protective layer containing a water-soluble polymeric binder are provided in this order on a substrate.

As a substrate, metals, plastic materials, paper and the like can be used, but an aluminum substrate is most recommendable. In case of using an aluminum substrate, it is subjected to surface treatments such as graining, anodizing and if necessary, sealing, etc. Known methods can be applied for these treatments.

Mechanical methods, electrolytic etching method, etc., can be used for graining. The mechanical methods include ball grinding, brushing, liquid phoning, buffing, etc. These methods may be used singly or in combination depending on the aluminum substrate composition and other factors. Electrolytic etching is recommended.

The electrolytic etching is carried out in a bath containing one or more of inorganic acids such as phosphoric acid, sulfuric acid, hydrochloric acid, nitric acid, etc. After graining, the substrate is subjected if necessary to a desmutting with an aqueous solution of an alkali or an acid, neutralization and washing with water.

Anodizing is conducted by using as the electrolyte a solution containing one or more of sulfuric acid, chromic acid, oxalic acid, phosphoric acid, malonic acid and the like, with an aluminum plate as anode. The amount of the anodized layer to be formed is preferably in the range from 1 to 50 $mg/dm^2$, more preferably from 10 to 40 $mg/dm^2$. The amount of the anodized layer formed can be determined, for example, by immersing the aluminum plate in a phosphoric acid/chromic acid solution (prepared by dissolving 35 ml of an 85% phosphoric acid solution and 20 g of chromium oxide (VI) in one liter of water) to dissolve the oxide layer and measuring the change of weight of the plate after dissolution of the oxide layer.

Sealing can be accomplished by various methods such as boiling water treatment, steam treatment, sodium silicate treatment, bichromate solution treatment, etc. The aluminum substrate may also be subjected to undercoat treatment with an aqueous solution of a water-soluble high molecular-weight compound or a metal salt of fluorozirconic acid or the like.

The photopolymerizable photo-sensitive layer is made of a photopolymerizable composition, and it usually contains an addition polymerizable compound having at least one ethylenic unsaturated double bond, a photopolymerization initiator and a polymeric binder.

The "addition polymerizable compound having at least one ethylenic unsaturated double bond" (hereinafter referred to as "ethylenic compound") used in the present invention is a compound having at least one ethylenic unsaturated double bond which, when the photopolymerizable composition has been exposed to active light, is addition polymerized and hardened by the action of the photopolymerization initiator. Exemplary of such compound are the monomers having the said double bond(s) and the polymers having an ethylenic unsaturated double bond(s) in the side or main chain. The term "monomer" used in the present invention is a concept as opposed to the "polymeric material", and it, therefore, includes, in addition to the monomers in a narrow sense of the word, the dimers, trimers and oligomers as well.

Such monomers having an ethylenic unsaturated double bond(s) include unsaturated carboxylic acids, esters of aliphatic polyhydroxy compounds and unsaturated carboxylic acids, esters of aromatic polyhydroxy compounds and unsaturated carboxylic acids, and esters obtained from esterification reaction of unsaturated carboxylic acids, polyvalent carboxylic acids and polyvalent hydroxy compounds such as above-mentioned aliphatic polyhydroxy compounds and aromatic polyhydroxy compounds.

Examples of the said esters of aliphatic polyhydroxy compounds and unsaturated carboxylic acids are not limited, but include acrylates such as ethylene glycol diacrylate, triethylene glycol diacrylate, trimethylolpropane triacrylate, trimethylolethane triacrylate, pentaerythritol diacrylate, pentaerythritol triacrylate, pentaerythritol tetraacrylate, dipentaerythritol tetraacrylate, dipentaerythritol pentacrylate, dipentaerythritol hexaacrylate and glycerol acrylate; methacrylates which substitute a methacrylic acid moiety for the acrylic acid moiety in the above esters, such as ethylene glycol dimethacrylate, triethylene glycol dimethacrylate, trimethylolpropane trimethacrylate, trimethylolethane trimethacrylate, pentaerythritol dimethacrylate, pentaerythritol trimethacrylate, pentaerythritol tetramethacrylate, dipentaerythritol tetramethacrylate, dipentaerythritol pentamethacrylate, dipentaerythritol hexamethacrylate, and glycerol methacrylate; itaconates which substitute a itaconic acid moiety for the acrylic acid moiety in the above esters, such as ethylene glycol diitaconate, triethylene glycol diitanocate, trimethylolpropane triitaconate, trimethylolethane triitaconate, pentaerythritol diitaconate, pentaerythritol triitaconate, pentaerythritol tetraitaconate, dipentaerythritol tetraitaconate, dipentaerythritol pentaitaconate, dipentaerythritol hexaitaconate, and glycerol itaconate; crotonates which substitute a crotonic acid moiety for the acrylic acid moiety in the above esters, such as ethylene glycol dicronate, triethylene glycol dicronate, trimethylolpropane tricronate, trimethylolethane tricronate, pentaerythritol dicronate, pentaerythritol tricronate, pentaerythritol tetracronate, dipentaerythritol tetracronate, dipentaerythritol pentacronate, dipentaerythritol hexacronate and glycerol cronate; and maleates which substitute a maleic acid moiety for the acrylic acid moiety in the above esters, such as ethylene glycol dimaleate, triethylene glycol dimaleate, trimethylolpropane trimaleate, trimethylolethane trimaleate, pentaerythritol dimaleate, pentaerythritol trimaleate, pentaerythritol tetramaleate, dipentaerythritol tetramaleate, dipentaerythritol pentamaleate, dipentaerythritol hexamaleate and glycerol maleate.

Examples of the esters of aromatic polyhydroxy compounds and unsaturated carboxylic acids include hydroquinone diacrylate, hydroquinone dimethacrylate, resorcin diacrylate, resorcin dimethacrylate, and pyrogallol triacrylate.

The esters obtained from esterification reaction of unsaturated carboxylic acids, polyvalent carboxylic acids and polyvalent hydroxy compounds may not necessarily be a single product, and their examples include a condensate of acrylic acid, phthalic acid and ethylene glycol, a condensate of acrylic acid, maleic acid and diethylene glycol, a condensate of methacrylic acid, terephthalic acid and pentaerythritol, and a condensate of acrylic acid, adipic acid, butanediol and glycerin.

Among other examples of the said ethylenic compounds are urethane acrylates such as addition reaction product of tolylene diisocyanate and hydroxyethyl acrylate; epoxy acrylates such as addition reaction product of diepoxy compound and hydroxyethyl acrylate; acrylamides such as ethylenebisacrylamide; acrylic esters such as diallyl phthalate; and the compounds having vinyl groups, such as divinyl phthalate.

Examples of the polymers having an ethylenic unsaturated double bond(s) in the main chain include polyesters obtained from polycondensation reaction of unsaturated divalent carboxylic acids and dihydroxy compounds, and polyamides obtained from polycondensation reaction of unsaturated divalent carboxylic acids and diamines. Examples of the polymers having an ethylenic unsaturated double bond(s) in the side chain include condensation polymers of divalent carboxylic acids having unsaturated bonds in the side chain, such as itaconic acid, propylidenesuccinic acid and ethylidenemalonic acid, and dihydroxy or diamine compounds. The polymers having functional groups with reaction activity such as hydroxyl group or halogenated methyl group, for example, the polymers obtained from polymeric reaction of polyvinyl alcohol, ploy(2-hydroxyethyl methacrylate), polyepichlorohydrin or the like and unsaturated carboxylic acids such as acrylic acid, methacrylic acid, crotonic acid, etc., can also be used favorably.

Of the said ethylenic compounds, the monomers of acrylic esters or methacrylic esters are especially preferred.

The photopolymerization initiator used in the present invention is not specified; it is possible to use all of the known photopolymerization initiators which are capable of initiating polymerization of the compounds having sensitivity to visible light rays and having at least one ethylenic unsaturated double bond. Such initiators are generally composed of an activating agent and a sensitizing agent. The activating agent used here is one which is self- and/or photo-excited to induce a certain action with a sensitizing agent such as mentioned below to generate active radicals. Exemplary of such activating agents usable here are hexaarylbiimidazoles, halogenated hydrocarbon derivatives, diaryliodonium salts and titanocenes. Of these activating agents, hexaarylbiimidazoles are most preferred because of good adherence of the coating to the substrate.

Examples of these biimidazole-based activating agents are 2,2'-bis(o-chlorophenyl)-4,4',5,5'-tetra(p-fluorophenyl) biimidazole, 2,2'-bis(o-chlorophenyl)-4,4',5,5'-tetra(p-iodophenyl)biimidazole, 2,2'-bis(o-chlorophenyl)-4,4',5,5'-tetra(p-chloronaphthyl)biimidazole, 2,2'-bis(o-chlorophenyl)- 4,4',5,5'-tetra(p-chlorophenyl)biimidazole, 2,2'-bis(o-bromophenyl)-4,4',5,5'-tetra(p-chloro-p-methoxyphenyl)biimidazole, 2,2'-bis(o-chlorophenyl)-4,4', 5,5'-tetra(o,p-dichlorophenyl)biimidazole, 2,2'-bis(o-chlorophenyl)- -4,4',5,5'- tetra(o,p-dibromophenyl) biimidazole, 2,2'-bis(o-bromophenyl)-4,4',5,5'-tetra(o,p-dichlorophenyl)biimidazole, and 2,2'-bis(o,p-dichlorophenyl)-4,4',5,5'-tetra(o,p-dichlorophenyl) biimidazole. If necessary, these biimidazoles may be used in combination with other kinds of biimidazole or activating agents. Biimidazoles can be easily synthesized by the methods such as disclosed in Bull. Chem. Soc. Japan, 33, 565 (1960) and J. Org. Chem., 36 [16] 2262 (1971).

The sensitizing agent used in the present invention may be selected from a wide variety of compounds which are capable of generating active radicals on irradiation with visible light when incorporated with an activating agent such as mentioned above. Exemplary of such sensitizing agents are triphenylmethane-based leuco dyes such as leucocrystal violet and leuco-malachite green disclosed in U.S. Pat. No. 3,479,185, light-reduced dyes such as erythrosine and eosine Y, aminophenyl ketones disclosed in U.S. Pat. No. 3,549,367 and U.S. Pat. No. 3,652,275, β-diketones disclosed in U.S. Pat. No. 3,844,790, indanones disclosed in U.S. Pat. No. 4,162,162, ketocumalins disclosed in Japanese Patent Application Laid-Open (Kokai) No. 52-112681, aminostyrene derivatives and aminophenylbutadiene derivatives disclosed in Japanese Patent Application Laid-Open (Kokai) No. 59-56403, aminophenyl heterocycles disclosed in U.S. Pat. No. 4,594,310, and julolidine heterocycles disclosed in U.S. Pat. No. 4,966,830.

A polymeric binder is used for imparting film-forming properties and viscosity adjustability to the composition. Examples of the polymeric binders usable in the present invention include single polymers or copolymers of (meth) acrylic acid, esterified products thereof, maleic acid, acrylonitrile, styrene, vinyl acetate, vinylidene chloride and the like; polyethylene oxide; polyvinyl pyrrolidone; polyamide; polyurethane; polyethylene terephthalate; polyacetyl cellulose; polyvinyl butyral; and the like.

The recommended ratios of the main constituents in the photopolymerizable composition are as follows (based on 100 parts by weight of the ethylenic compound): the sensitizing agent is generally 0.01 to 20 parts by weight, preferably 0.05 to 10 parts by weight; the activating agent is generally 0.1 to 80 parts by weight, preferably 0.5 to 50 parts by weight; the polymeric binder is generally 10 to 400 parts by weight, preferably 20 to 200 parts by weight; and the pigment is 0.1 to 20 parts by weight, preferably 0.5 to 10 parts by weight.

In the photopolymerizable composition, beside the above constituents, there may further be contained other substances according to the purpose of use. For example, heat polymerization inhibitors such as hydroquinone, p-methoxyphenol and 2,6-di-t-butyl-p-cresol; plasticizers such as dioctyl phthalate, didodecyl phthalate and tricresyl phosphate; sensitivity improvers such as tertiary amines and thiol; and pigment precursor can be cited.

As for the ratios of these additives, the heat polymerization inhibitors are not more than 2 parts by weight based on 100 parts by weight of the ethylenic compound, the plasticizers are not more than 40 parts by weight based on 100 parts by weight of the ethylenic compound, and the pigment precursors are not more than 30 parts by weight based on 100 parts by weight of the ethylenic compound.

The photopolymerizable composition described above, either after diluted with a proper solvent or without such dilution, is coated on a substrate such as mentioned above, and dried to form a photo-sensitive layer. Known coating methods such as dip coating, rod coating, spin coating, spray coating, roll coating, etc., can be used. The coating thickness is preferably 0.1 to 10 g/m$^2$. The drying temperature is preferably 30° to 150° C., more preferably 40° to 110° C.

In the photopolymerized type pre-sensitized planographic printing plate, a protective layer is provided on the photo-sensitive layer. The protective layer is provided for the purpose of barriering oxygen which causes a polymerization inhibitory action. This layer is preferably formed by coating a solution of a water-soluble polymeric binder in an aqueous solvent on the photo-sensitive layer and drying the resultant coat.

As the water-soluble polymeric binder to be contained in the protective layer, there can be used various known types of water-soluble polymeric condensation agents, such as polyvinyl alcohol, polyvinyl pyrrolidone, polyethylene oxide, cellulose, etc., or mixtures thereof. Among of them, polyvinyl alcohol and polyvinyl pyrrolidone are especially preferred. The same coating methods as used for the photo-sensitive layer may be used for coating of the protective layer. The coating thickness is usually 0.5 to 10 g/m$^2$, preferably 2 to 5 g/m$^2$. The drying temperature is generally 30° to 110° C., preferably 40° to 70° C.

In case where the developing process of the present invention is applied to a pre-sensitized planographic printing plate in which at least a photo-sensitive layer made of a photopolymerizable composition and a protective layer containing a water-soluble polymeric binder are formed in that order on a support, it is preferable that the protective layer of the said plate be dissolved away by using a development pre-rinse solution (hereinafter referred to as pre-rinse solution) before conducting development. The water-soluble polymeric binders are normally hard to dissolve in the alkaline developers, so that a high-sensitivity photopolymerized type pre-sensitized planographic printing plate having a water-soluble polymeric binder-containing protective layer laminated on a photo-sensitive layer requires a longer time for development than the generally used pre-sensitized planographic printing plate. Also, since the substances other than the photo-sensitive layer composition, such as the water-soluble polymeric binder are dissolved in the developer during the developing operation, the developer becomes shorter life than when used for the ordinary pre-sensitized planographic printing plate. Further, for the said reason, the developer is increased in viscosity in use, and becomes more liable to attach to the rollers and other elements, causing locking thereof when the attached solution is dried.

In case where the protective layer is dissolved away by using a pre-rinse solution, since there is no possibility of the protective layer material being mixed in the developer during development of the pigment-containing non-silver-salt photo-sensitive material, the developer is bettered in durability and the developing time can be shortened. Regarding the pre-rinse solution, a detailed explanation will be given later.

The developer disposing process and apparatus according to the present invention are described in detail with reference to FIGS. 1 and 2.

FIG. 1 is a schematic illustration of a disposing apparatus for the developer for pigment-containing non-silver-salt photo-sensitive material according to the present invention.

The developer which has been used for the development of a pigment-containing non-silver-salt photo-sensitive material in a developing apparatus (not shown) is overflown or discharged out from an outlet at the bottom of the developing apparatus and led into a waste developer storage tank 2 through a pipeline 1. The waste developer storage tank 2 is provided with a pipeline for passing the waste developer into a filter unit 3 and a waste fluid discharge means. Preferably a pump is installed in the pipeline for passing the waste developer into the filter unit 3. At a stage when the waste developer was stored to a certain level in the waste developer storage tank, the said pump is operated to supply the waste developer into the filter unit 3 which is so designed as not to allow the pigment particles to pass through and as to allow the solution to be treated to flow horizontally to the surface of the filter membrane. The portion of the waste developer which did not pass through the filter may be discharged out of the apparatus, but preferably it is returned to the said storage tank 2 through a pipeline 4. The solution which has passed through the filter is guided out through a pipeline 5 and recovered as a regenerated developer. The filtering process is carried on while the pump is in operation, so that the waste developer in the storage tank decreases by an amount of the solution which has passed through the filter, resulting in a corresponding increase of concentration of the insoluble matters such as pigment in the waste developer. At a stage when the liquid level in the storage tank lowered to or below a prescribed line, the pump is stopped, with the filtering process being also stopped. Here, the concentrated waste fluid in the storage tank is discharged out by a waste fluid discharge means.

For controlling the said series of disposing operations, preferably a level sensor for detecting the surface of the waste developer is provided in the waste developer storage tank 2 and the signal from the said sensor is relayed to the pump so as to allow to operate or stop its operation.

The material of the waste developer storage tank 2 is not restricted, and it is possible to use any suitable material as far as it is resistant to the developer used. The tank capacity is also not defined, but usually it preferably falls in a range from 0.1 to 15 liters, more preferably 1 to 5 liters.

FIG. 2 is a schematic sectional illustration of an embodiment of the disposing apparatus for the developer for pigment-containing non-silver-salt photo-sensitive material according to the present invention.

The waste developer discharged from a developing tank 6 is once supplied into a buffer tank 8 through a pipeline 7 and thence led into a waste developer storage tank 9 through a valve SV1. The waste developer in the said storage tank 9 is supplied into a filter unit 11 through a pump 10 for filtration. The portion of the solution which was unable to pass through the filter is returned to the storage tank 9 through a pipeline 12 while the solution which has passed through the filter is recovered as a regenerated developer and returned to the developing tank 6 through a pipeline 13. At a stage when the concentration of the insolubles in the waste developer in its storage tank 9 has reached a certain value, the pump 10 is stopped and the valve SV2 is opened, allowing the concentrated waste fluid to discharge out through a pipeline 14.

The development apparatus according to the present invention can be used in combination with various types of developing systems for developing the pigment-containing non-silver-salt photo-sensitive materials such as mentioned above. Especially in case where a pre-sensitized planographic printing plate having a photopolymerizable sensitive layer and a water-soluble polymeric binder-containing protective layer laminated successively on a support is used as the pigment-containing non-silver-salt photo-sensitive material, it is expedient to adopt an automatic developing system comprising a pre-rinse section for dissolving away the protective layer by using a pre-rinse solution, a development section for conducting development of the photo-sensitive layer, and the development apparatus of the present invention for disposing of the waste developer solution from the development section.

In case of using this system, since the protective layer is dissolved away in the pre-rinse section, there is no possibility that the protective layer be removed and mixed in the developer during development of the pigment-containing non-silver-salt photo-sensitive material, so that the life of the developer is elongated and the time required for development is shortened. Further, the disposal of the developer by the developer disposing apparatus of the present invention can be conducted efficiently and the problems such as compaction of the filter are eliminated.

It is also preferable that the said automatic developing system be further provided with a pair of entry rollers and a pair of squeeze rollers in the pre-rinse section, and a means for supplying the pre-rinse solution to at least the said entry rollers.

Thus, according to the developing system of the present invention, since the water-soluble polymeric binder forming the protective layer is dissolved away, there is little chance for the occurrence of troubles such as adhesion of the said binder to the upper and lower rollers and blocking thereof during the apparatus is not working.

Means for supplying the pre-rinse solution is not specified in the present invention, but usually it has a pre-rinse solution feed pipe(s) and a feed opening(s). The shape and structure of such feed pipe(s) and feed opening(s) are not defined as far as they allow efficient removal of the protective layer, but generally there is used a shower pipe capable of shower-like supply of the solution.

The pre-rinse solution supplying means is preferably of a mechanism that allows supply of the pre-rinse solution to the planographic printing plate from above its surface. It is also preferable that this means is so designed as to supply the pre-rinse solution not only to the printing plate but also at least to the entry rollers and, if necessary, to the squeeze rollers as well.

The pre-rinse solution used for removing the protective layer may be any liquid which is capable of dissolving away the protective layer containing a water-soluble polymeric binder, but in view of safety and other matters such as discharge load, it is preferable that this solution is substantially composed of water with small amount of additives blended as desired. Examples of the additives usable here are a surfactant for improving solubility of the water-soluble polymeric binder, a defoaming agent for suppressing frothing, and a hard water softening agent for reducing hardness of water.

The temperature at which the pre-rinse solution is used is at least 10° C., preferably in the range from 20° to 50° C., more preferably from 25° to 40° C.

In the present invention, the pre-rinse solution supplying means may double as a roller cleaning fluid supplying means. That is, the pre-rinse solution supplying means may be designed to be capable of supplying a fluid for cleaning the rollers instead of supplying the pre-rinse solution by switchover of a valve.

The purpose of use of the cleaning fluid is to clean the rollers for preventing their blocking during the apparatus is not working. Therefore, the cleaning fluid may be any fluid which can attain the said purpose and can be dissolved in the pre-rinse solution, and it may, for instance, be the unused pre-rinse solution or water.

It is recommendable to apply the unused pre-rinse solution as the cleaning fluid as it is possible to attain the said purpose and also the used cleaning fluid can be dissolved in the pre-rinse solution. It is more advantageous when the pre-rinse solution is substantially water and the cleaning fluid is the mused pre-rinse solution, as it is possible to remove the water-soluble polymeric binder attached to the rollers and also the used cleaning fluid can be recycled for use as the pre-rinse solution.

An embodiment of the automatic developing system according to the present invention is described below with reference to FIG. 3.

In the drawing, the pre-sensitized planographic printing plate is carried while being supported by the rollers, indicated by crosshatching, on a fine line in the drawing from left to right. The portion 15 depicted by a bold line in FIG. 3 is a pre-rinse tank. When the pre-sensitized planographic printing plate is entered into the system from its entry, the pre-rinse solution is sprayed from the shower pipes 18, 19 toward the entry rollers 16 and squeeze rollers 17, whereby the protective layer of the said printing plate is dissolved away. The pre-rinse solution to be discharged from the shower pipes is stored in the portion of the tank 15 below an overflow drain 20 and supplied to the shower pipes by a circulation pump 21. The shower pipes are also so designed that a fluid for cleaning the rollers can be supplied thereto from a different system (usually a tap water) through a solenoid valve 22. The pre-rinse tank 15 may be of any size as far as it is capable of storing a certain amount of the pre-rinse solution (preferably not less than 10 liters, more preferably not less than 20 liters). The length of the pre-rinse tank is preferably from 5 cm to 40 cm, more preferably from 10 cm to 30 cm, as measured between the center of the rollers 16 and the center of the rollers 17.

As for the timing of supplying the cleaning fluid to the shower pipes for cleaning the rollers, it is preferable that the cleaning fluid be supplied at the end of the day's work, namely just before shutdown of the system, after stopping the circulation pump 21. It is also possible to adopt a sequential supply scheme according to which the cleaning fluid is supplied piecemeal on passage of each plate through the pre-rinse section.

The former timing is preferred, and in this case, the amount of the cleaning fluid to be used for cleaning the rollers in one operation is preferably not less than 2 liters, more preferably not less than 5 liters.

The pre-sensitized planographic printing plate which has been cleared of the protective layer in the pre-rinse section proceeds into a developing tank 23 and developed imagewise therein.

The waste developer discharged out from the developing tank 23 is led into, for instance, the developer disposing apparatus of the present invention shown in FIG. 2 through a pipeline (not shown). The solution which has passed through the filter is returned to the developing tank through a pipeline and reused as the developer.

The imagewise developed printing plate is then washed in a wash tank 24, gum-coated in a gum tank 25, and finally dried by a dryer 26.

BRIEF DESCRIPTION OF THE DRAWINGS

FIG. 3 is a schematic illustration of an embodiment of the developing system according to the present invention.

BEST MODE FOR CARRYING OUT THE INVENTION

The present invention is described in more detail hereinbelow with reference to the examples thereof, which examples however are merely intended to be illustrative and not to be construed as limiting the scope of the invention in any way.

EXAMPLE 1 and Comparative Example 1

<Making of pigment-containing pre-sensitized planographic printing plate 1>

A 0.24 mm-thick aluminum plate was grained by electrolytic etching using hydrochloric acid, then desmutted with a sodium hydroxide solution, neutralized, washed with water, and anodized with a phosphoric acid solution to an anodized coating weight of 25 g/m². On the thus obtained substrate was coated a dispersion of a pigment-containing photo-sensitive composition of the following formulation by a wire bar coater to a dry coating thickness of 2.2 g/m², followed by drying, thereby obtain a pigment-containing pre-sensitized planographic printing plate 1.

| Developer composition | |
| --- | --- |
| Sodium metasilicate (nonahydrate) | 5.0% by weight |
| Sodium alkylnaphthalenesulfonate (Pelex NBL, Kao Corp.) | 3.0% by weight |
| Desalted water | 91.5% by weight |

<Filter>

Filter was provided separately from the plate processor. A 5-liter polyethylene tank was used as storage tank 2 in FIG. 1, and a magnet pump MD-50R (Iwaki Corp.) was used as P in FIG. 1. An ultrafiltration module FS-03 (Daisen Membrane System Ltd.) using a hollow fiber membrane made of

| Dispersion of pigment-containing photo-sensitive composition | |
| --- | --- |
| Sensitizing agent (S-1) | 1.5 parts by weight |

S-1

[structure]

| Activating agent (I-1) | 13 parts by weight |
| --- | --- |

I-1

[structure]

| 2-Mercaptobenzothiazole | 10 parts by weight |
| --- | --- |
| Methyl methacrylate/methacrylic acid copolymer (Mw: 45,000; molar ratio: 85/15) | 40 parts by weight |
| Trimethylolpropane triacrylate | 60 parts by weight |
| Phthalocyanine pigment (Cyanine Blue 4920 produced by Dainichi Seika Co., Ltd) | 3 parts by weight |
| Methyl ethyl ketone | 90 parts by weight |

<Condition of Exposure and development>

An original film with an image area percentage of 10% was placed on the said pigment-containing pre-sensitized planographic printing plate 1 (50 cm×80 cm) and imagewise exposed to a 4 kw metal halide lamp from a distance of 50 cm for 20 seconds.

Figure 1:
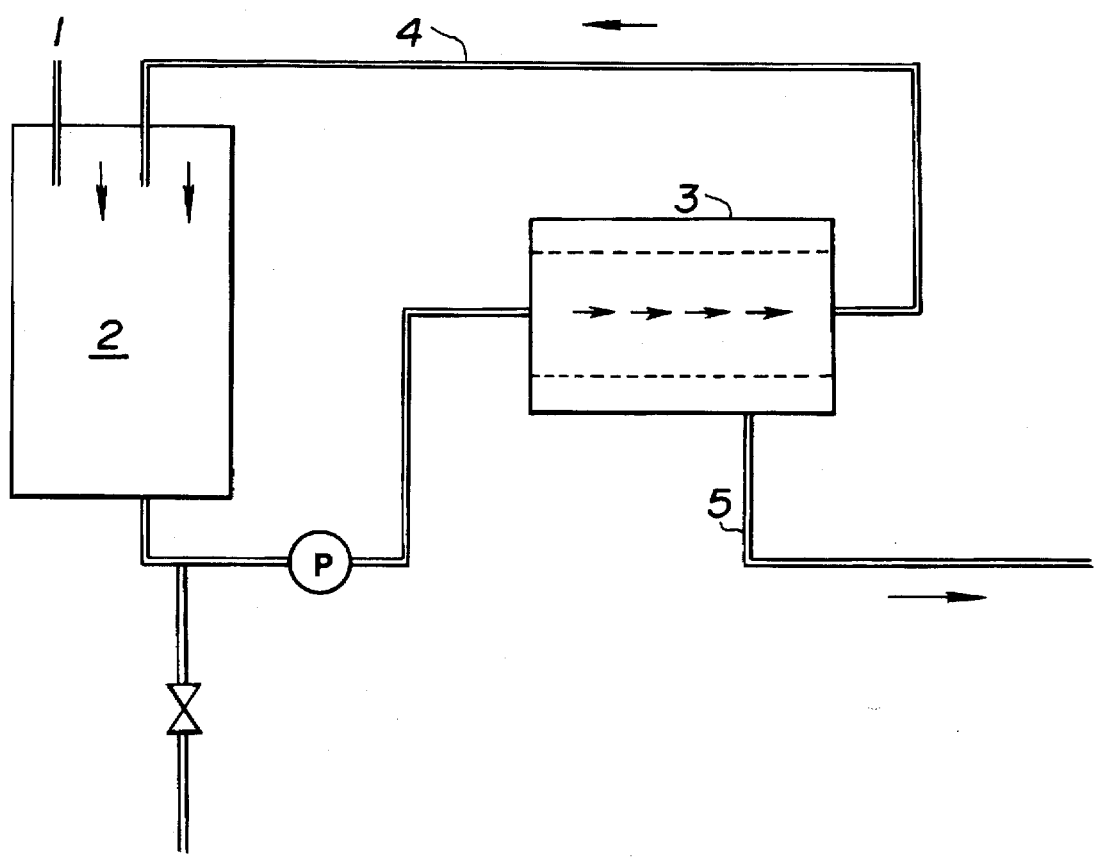
FIG. 1 is a schematic illustration of a disposing apparatus for the developer used for the development of pigment-containing non-silver-salt photo-sensitive materials according to the present invention.
Figure 2:
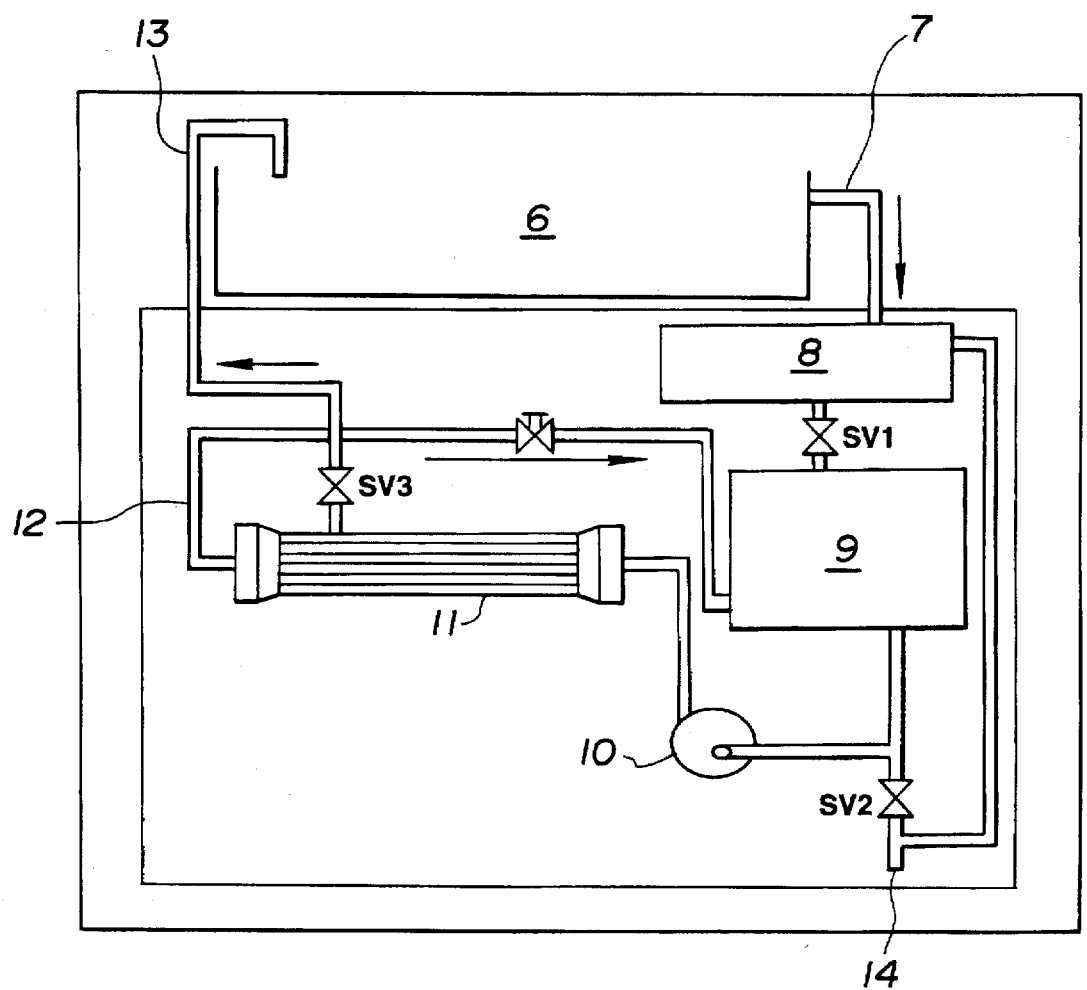
FIG. 2 is a schematic sectional illustration of an embodiment of the disposing apparatus for the waste developer used for the development of pigment-containing non-silver-salt photo-sensitive materials according to the present invention.

20 liters of a developer of the following composition was supplied into the developing tank of the automatic developing system (plate processor) shown in FIG. 3, with the developing temperature set at 30° C. Carriage speed was set so that the developing time would become 30 seconds. 10 liters of water was supplied into each of the water washing tank and the finisher tank.

polyether sulfone with a cut off molecular weight of 150,000 (FUS-1581, Daisen Membrane System Ltd.) was used as filter 3 in FIG. 1.

<Development and treatment of waste developer>

The imagewise exposed pre-sensitized planographic printing plates 1 were treated in the said plate processor at a rate of 20 plates based on hour and 5 hours per day, for 5 days. The developer was replenished at a percentage of 50 ml based on 1 m² of the area treated. All of the solution which overflowed from the developing tank on replenishment was collected in the tank 2. Further, the developer was withdrawn from the developing tank once every two hours to fill up the tank 2. Each time the tank 2 was filled up, the filtering process of the waste developer was started and the filtered solution was drawn out while the solution which did not pass through the filter was cycled back to the tank 2.

When the total amount of the filtered solution reached 4 liters, the filtering process was finished, and the non-filtered solution which remained in the tank 2 was discharged out of the system. The operation was controlled so that one round of filtering process would be completed in 30 minutes, and when the tank 2 was filled up for the next round of process, 4 liters of the filtered solution in the previous filtering process was supplied into the developing tank.

As for the operating conditions for filtration, the inlet pressure of the hollow fiber was about 0.6 kg/cm$^2$ and the temperature of the waste developer was mostly kept at 30° C.

<Evaluation>

During the developing process of the said pre-sensitized planographic printing plates in the manner described above, the state of compaction of the spray nozzles (shower pipe) of the plate processor and formation of the precipitate in the developer were examined after treatment of every 100 plates. The evaluation results are shown in Table 1.

For the purpose of examining contamination of the non-image portion by the pigment and other matters accumulated in the developer, printing was carried out with the developed and water-washed pre-sensitized planographic printing plates by a Heiderberg GTO Printer at a rate of once based on 100 sheets, and the degree of stain of the non-image portion of the 100th sheet of printed paper from the onset of printing was measured by a reflection type optical densitometer. It was found that the optical density was 0.00 in all the printed sheets subject to the defined number of the treated plates shown in Table 1.
(Example 1).

In Comparative Example 1, the same developing process was carried out with the pre-sensitized planographic printing plates as in Example 1 except that no developer process was conducted. The results of the evaluation made in the same way as in Example 1 are shown in Table 1. In this case, the optical density was also 0.00 in all the printed sheets subject to the defined number of the treated sheets shown in Table 1.

TABLE 1

| Number of sheets | Example 1 Compaction of nozzles and formation of precipitate | Comp. Example 1 Compaction of nozzles and formation of precipitate |
|---|---|---|
| 1 | None | None |
| 101 | None | Slight formation of precipitate |
| 201 | None | Much formation of precipitate |
| 301 | None | Much compaction of nozzles |
| 401 | None | |
| 497 | None | Hard to develop |

As is seen from Table 1, according to the developing method using the developer treating techniques of the present invention, there takes place no compaction of the spray nozzles of the plate processor nor formation of the precipitate in the developer. There also occurs no fouling of the non-image portion of the print due to adherence of the pigment and/or other matters. In Comparative Example 1, it is required to exchange the mother liquor of the developer at a point when the number of the plates processed exceeded 100, so that this portion of the developer is wasted. Therefore, according to the developing method using the developer disposing means of the present invention, it is possible to reduce the amount of the waste fluid.

EXAMPLE 2

On the photopolymerizable layer of a pigment-containing pre-sensitized planographic printing plate was wire bar coated a protective layer solution of the following composition containing a water-soluble polymeric binder to a dry coating thickness of 2.8 g/m$^2$, followed by drying to obtain a pre-sensitized planographic printing plate 2 having a protective layer containing a water-soluble polymeric binder laminated on a photopolymerizable photo-sensitive layer.

| Protective layer forming solution containing a water-soluble polymeric binder | |
|---|---|
| Polyvinyl alcohol GL-03 (produced by Japan Synthetic Chemical Ind. Co., Ltd.) | 10 parts by weight |
| Liponox NC-95 (produced by Lion Corp.) | 0.02 part by weight |
| Desalted water | 90 parts by weight |

<Exposure and developing conditions>

The said pre-sensitized planographic printing plate 2 was imagewise exposed for an image area percentage of 10% by internal drum type scanning exposure with argon ion laser (output: 35 mW; wavelength: 488 nm).

There was used a plate processor shown in FIG. 3 having a development pre-rinse tank installed in the developing system used in Example 1. 20 liters of 30° C. water was contained in the pre-rinse tank as the pre-rinse solution. Setting was made so that this water would be sprayed from the shower pipe against the entry and squeeze rollers in the pre-rinse section at a rate of 15 liters per minute by the operation of a circulation pump on entry of every printing plate into the system.

The shower pipe was so arranged that a fluid for cleaning the rollers would be supplied from a tap water through a solenoid valve. This solenoid valve was designed such that when the switch button was pushed once, the valve would be kept open for 30 seconds, allowing supply of tap water to the shower pipe. Approximately 10 liters of water is supplied when the tap water is kept open for 30 seconds, so that when the switch button of the solenoid valve is pushed once, about 5 liters of water is supplied to the entry rollers and the squeeze rollers respectively. When this cleaning water is supplied, there takes place overflow from the overflow drain provided at a level in the pre-rinse tank corresponding to a volume of 20 liters of the solution in the tank, the overflowed solution being directly guided into sewerage.

20 liters of a developer of the same composition as used in Example 1 was supplied into the developing tank, and the developing temperature was set at 30° C. Also, 10 liters of water was supplied into the gum tank.

The pre-sensitized planographic printing plate carriage speed was set at 100 cm/min. In this case, the pre-rinse time is about 10 seconds, and the dipping time in the developer is about 12 seconds.

The pre-sensitized planographic printing plates 2 (50 cm×80 cm) which had been exposed under the above-described conditions were treated successively by the said plate processor at a rate of 20 plates per hour and 5 hours per day, for 5 days. The developer replenishment and process were conducted in the same way as in Example 1. On completion of the developing process, the changeover switch of the solenoid valve was pushed once to supply the cleaning water for cleaning the rollers. Then power to the system was disconnected and the system was left in this (inoperative) state for 3 days.

<Evaluation>

During the above process, the state of compaction of the spray nozzles (shower pipe) in the developing tank of the plate processor and formation of the precipitate in the developer were examined after process of every 100 plates. There was observed no compaction of spray nozzles nor formation of precipitate during process of 500 plates.

Further, for the purpose of examining stain of the non-image portion by adherence of the pigment and other matters in the developer, the printing was carried out with the developed pre-sensitized planographic printing plates 2 by a Heiderberg GTO printer at a percentage of once per 100 plates, and the degree of stain of the non-image portions of every 100th sheets from the start of printing was measured in terms of optical density. The optical density was 0.00 in all of the prints. Also, the development quality, particularly residual emulsion of the non-image portion, of all of the processed pre-sensitized planographic printing plates were examined. All of the plates showed excellent development quality.

After 5 days of process, the check was made for compaction of the hollow fiber membrane of the filter. There was seen no adherence of solid matter on the inside of the membrane. Examination was also made for sludge in the developing tank after 3-day standing, but no sludge was detected in the developing tank. There was also noted no blocking of the entry rollers and the squeeze rollers in the pre-rinse section after 3-day standing.

EXAMPLE 3

Using the pre-sensitized planographic printing plates 2, the same developing process and the same developer process as in Example 2 were carried out by a plate processor having no pre-rinse section. As a result, there was observed no formation of the precipitate in the developing tank nor compaction of the spray nozzles after one day of process, but it was confirmed that the passing rate of the solution through the filter became lower day by day. So, check was made for compaction of the hollow fiber membrane of the filter after 5 days of process. Deposition of solid matter on the inside of the membrane was admitted.

INDUSTRIAL APPLICABILITY

The developer disposing process of the present invention enables an appreciable decrease of discharge of waste developer. Further, by carrying out the developing process in combination with the developer disposing process of the present invention, a long-time stabilized continuous operation of development is realized.

Moreover, by using the plate processor for the pre-sensitized planographic printing plates according to the present invention, it is possible to conduct the developing process of the high-sensitivity photopolymerized type planographic printing plates quickly and efficiently with an alkaline developer as in the case of the ordinary pre-sensitized planographic printing plates, and still further, formation of sludge in the developer is inhibited to elongate the life of the developer.

What is claimed is:

1. A process for disposing of a waste developer used for the development of pigment-containing non-silver-salt photo-sensitive materials, comprising subjecting the waste developer to a separating treatment by a filter means which does not allow pigment particles to pass through and allows the waste developer solution to be treated to flow horizontally to the surface of a filtering membrane, and reusing the obtained solution which passed through the filtering membrane as a developer.

2. The process according to claim 1, wherein the filter means is not a whole filtration system and comprises hollow fiber-like precision filtration membranes, hollow fiber-like ultrafilteration membranes or a combination thereof.

3. The process according to claim 1, wherein the pigment-containing non-silver-salt photo-sensitive material is a pre-sensitized planographic printing plate, a color filter or a solder resist.

4. The process according to claim 1, wherein the pigment-containing non-silver-salt photo-sensitive material is a pre-sensitized planographic printing plate in which a photopolymerizable photo-sensitive layer and a protective layer containing a water-soluble polymeric binder are laminated successively on a substrate.

5. The process according to claim 1, wherein the pigment-containing non-silver-salt photo-sensitive material is a pre-sensitized planographic printing plate in which a photopolymerizable photo-sensitive layer and a protective layer containing a water-soluble polymeric binder are laminated successively on a substrate, and said protective layer of the pre-sensitized planographic printing plate is dissolved away with a pre-rinse solution prior to the developing operation.

\* \* \* \* \*